(12) United States Patent
 Price

(10) Patent No.: US 8,212,585 B1
(45) Date of Patent: Jul. 3, 2012

(54) PROGRAMMABLE LOGIC DEVICE

(75) Inventor: Neil Price, Bristol (GB)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/075,630

(22) Filed: Mar. 30, 2011

(51) Int. Cl.
 *H03K 19/177* (2006.01)
(52) U.S. Cl. ............................ 326/39; 326/38; 326/93
(58) Field of Classification Search ............ 326/37–41, 326/47, 93–98
 See application file for complete search history.

(56) References Cited

U.S. PATENT DOCUMENTS

| | | | |
|---|---|---|---|
| 5,051,620 A | | 9/1991 | Burgin |
| 6,219,284 B1* | | 4/2001 | Sample et al. ........... 365/189.08 |
| 7,570,079 B2 | | 8/2009 | Sima et al. |
| 2008/0238476 A1* | | 10/2008 | Lewis et al. ..................... 326/40 |
| 2008/0278203 A1* | | 11/2008 | Obkircher ..................... 327/116 |
| 2010/0156476 A1* | | 6/2010 | Obkircher ..................... 327/119 |
| 2011/0304371 A1* | | 12/2011 | Ravi et al. ..................... 327/175 |

* cited by examiner

*Primary Examiner* — Shawki S Ismail
*Assistant Examiner* — Jany Tran
(74) *Attorney, Agent, or Firm* — Panasonic Patent Center; Dhiren Odedra; Kerry Culpepper

(57) ABSTRACT

A programmable logic device includes a plurality of logic blocks and a plurality of routing networks. One of the routing networks receives an output signal of one of the plurality of logic blocks and a master clock signal. The routing network includes a pre-charge driver which includes: a delayed clock signal generator generating a delayed clock signal which delays predetermined time from a master clock signal; a pre-charge drive signal generator which receives the output signal of the delayed clock signal generator and the master clock signal and outputs a pre-charge drive signal; an enable circuit which receives an output signal of the pre-charge drive signal generator and outputs a constant signal or the pre-charge drive signal; and an output circuit which receives an output signal of the enable circuit and the output signal of the logic block and outputs one.

5 Claims, 19 Drawing Sheets

PROGRAMMABLE LOGIC DEVICE

TECHNICAL FIELD

The technical field relates to the field of programmable logic devices (including field programmable gate arrays) and in particular, but not exclusively, to circuits for the implementation of routing networks for reconfigurable devices.

BACKGROUND ART

Programmable logic devices (PLDs) typically comprise a plurality of logic units each configurable by data stored in associated configuration memories. In operation, data is transferred between logic elements via a routing network comprising a number of programmable interconnects joining the logic elements together. By transferring data between the logic units the programmable logic device is able to perform useful logic functions.

It is desirable for the routing between the logic units to operate at high speed so that the functions of the device can be performed efficiently. However, there are a number of problems to be overcome in order to implement high speed routing network designs.

A number of conventional techniques exist to increase the speed of routing networks which typically include the use of custom design techniques. For example, custom switches can be implemented comprising either nMOS only transistors or pass gates. One solution to providing a fast interconnection utilizing nMOS pass transistors is described in, for example, U.S. Pat. No. 7,570,079. It is well known to those skilled in the art that nMOS pass transistors are substantially faster than their pMOS equivalents, or complementary MOS logic (CMOS).

The performance of an application mapped to a PLD is determined by the worst delay for the longest path out of all of the paths in the application. If the worst delays in the longest paths of an application can be reduced, then the total performance for the application can increase.

In turn, a path in an application is composed of two separate types of elements: logic elements (LE-complex ALUs, look-up tables, etc) and routing network segments (RNS). These two differ in the fact that LEs may compute a logical function of one or more inputs (Z=A+B, Z=A|B, ... ), whereas RNSs only transfer data without changing the logical function (Z=A). A typical path consists of alternate LEs and RNSs, and the delay(s) associated with the path are a combination of the delays for the LEs and the RNSs.

Typically each RNS is associated with two delays, one delay (rising) where the signal starts off from a low voltage and increases to a high voltage and one delay (falling) where the signal starts off from a high voltage and decreases to a low voltage. These delays are often different, so the longest one is likely to determine the application performance.

Standard application specific integrated circuit (ASIC) design techniques will try to optimise the two delays simultaneously, so that the difference between the worst delay and best delay is as small as possible.

Another technique effectively used by ASIC designers is logic pre-charging, as described, for instance, in U.S. Pat. No. 5,051,620. This technique can be used effectively in ASIC design but cannot be applied to PLDs due to the programmability of the device.

SUMMARY

The optimisation of two delays (as described above) leads to suboptimal solutions, because compromises have to be made while optimising for both rising and falling edges. According to embodiment described below, this issue is avoided by allowing the PLD designer to focus on the optimisation of only one type of edges (rising or falling).

As discussed above, a typical path consists of alternate LEs and RNSs, and the delay(s) associated with the path are a combination of the delays for the LEs and the RNSs. A concern of the present disclosure is to reduce the delay associated with the RNSs.

Another concern of the present disclosure is an approach to effectively apply pre-charging techniques to PLDs.

In view of the above, as well as other concerns, a programmable logic device includes a logic block, a pre-charge driving device and a routing network. The pre-charge driving device includes: a first selecting device for selecting one of a plurality of delayed clock signals; a pre-charge drive signal generator outputting a pre-charge drive signal based upon the selected one of the plurality of delayed clock signals and a master clock signal; a second selecting device for selecting one of the pre-charge drive signal or a constant signal; and an output circuit for generating a pre-charge output signal to the routing network based upon an output signal of the second selecting device and a logic delay output signal received from the logic block. The pre-charge drive signal generator is configured to generate the pre-charge drive signal for a time duration starting from the beginning of a clock cycle indicated by the master clock signal to a delay time corresponding to the selected one of the plurality of delayed clock signals.

According to another aspect, the time duration is greater than or equal to a maximum time necessary for the logic delay to generate the logic delay output signal.

According to another aspect, the pre-charge driver device is configured to generate the pre-charge drive signal during the time duration as a high signal, and a transition time duration for which the pre-charge output signal transitions from high to low is less than a transition duration for which the pre-charge output signal transitions from low to high.

According to another aspect, the pre-charge driver device is configured to generate the pre-charge drive signal during the time duration as a low signal, and a transition time duration for which the pre-charge output signal transitions from low to high is less than a transition duration for which the pre-charge output signal transitions from high to low.

A programmable logic device according to another aspect includes a plurality of logic blocks and a plurality of routing networks. One of the plurality of routing networks which receives an output signal of one of the plurality of logic blocks and a master clock signal comprises a pre-charge driver which includes: a delayed clock signal generator which generates a delayed clock signal which delays predetermined time than a master clock signal; a pre-charge drive signal generator which receives the output signal of the delayed clock signal generator and the master clock signal and output a pre-charge drive signal; an enable circuit which receives an output signal of the pre-charge drive signal generator and output one of a constant signal or the pre-charge drive signal; and an output circuit which receives an output signal of the enable circuit and the output signal of one of the plurality of logic blocks and output one of the input signal.

A device including the programmable logic device according to the above aspects can achieve higher speed.

DESCRIPTION OF EMBODIMENTS

Embodiment 1

Figure 1:
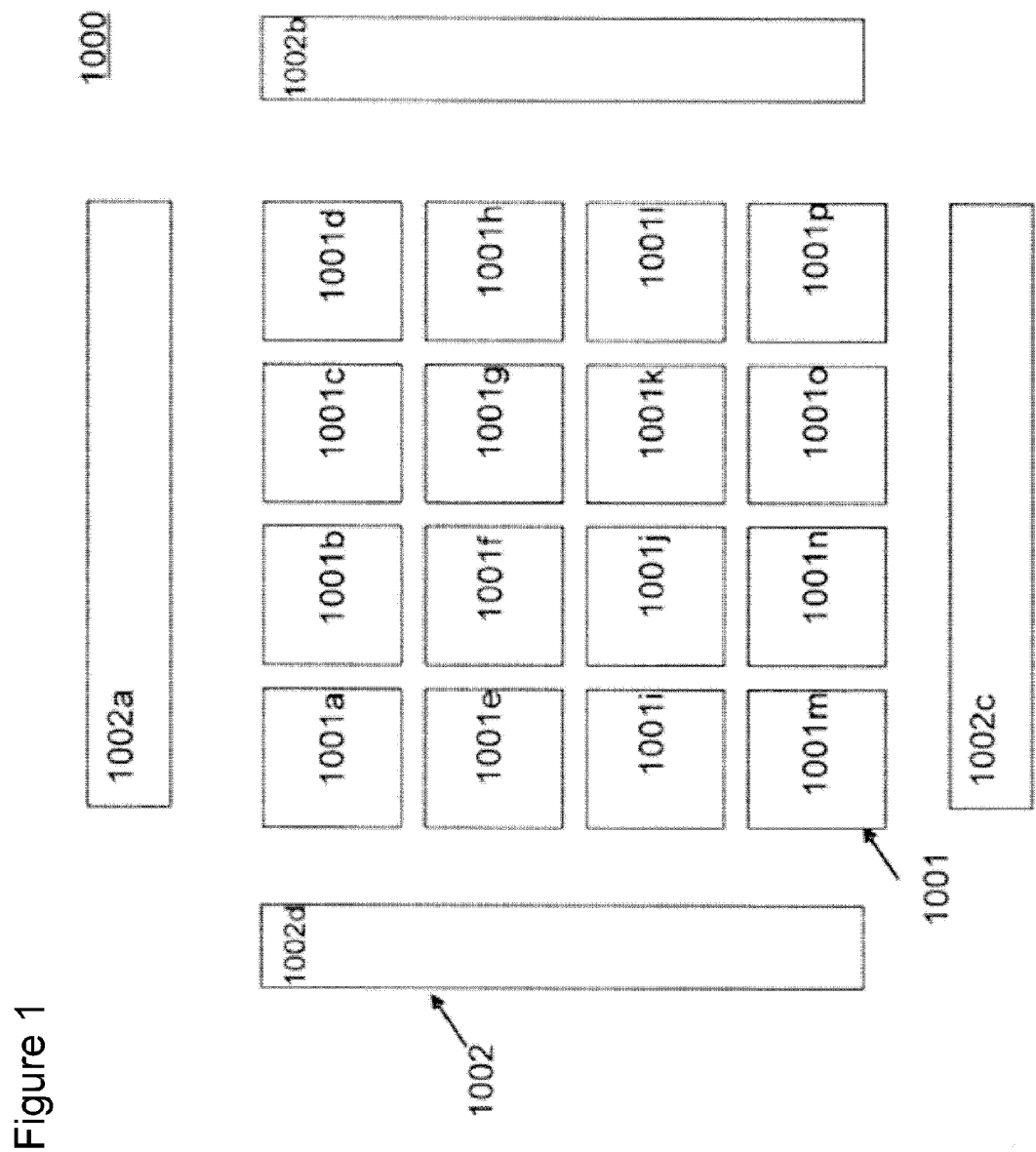
FIG. 1 is a diagram illustrating a simplified architecture of a programmable logic device (PLD).

FIG. 1 illustrates a simplified architecture of a programmable logic device (PLD) 1000 according to a first embodiment in plan view. The PLD 1000 includes an array of tiles 1001a-1001p, programmable input/output (I/O) blocks 1002a-1002d. Some of the tiles 1001a-1001p and I/O blocks 1002a-1002d are connected by a number of connecting lines (not shown in FIG. 1). Clock signals are distributed by, for example, clock trees such as a balanced tree (e.g. the H clock tree).

Figure 2:
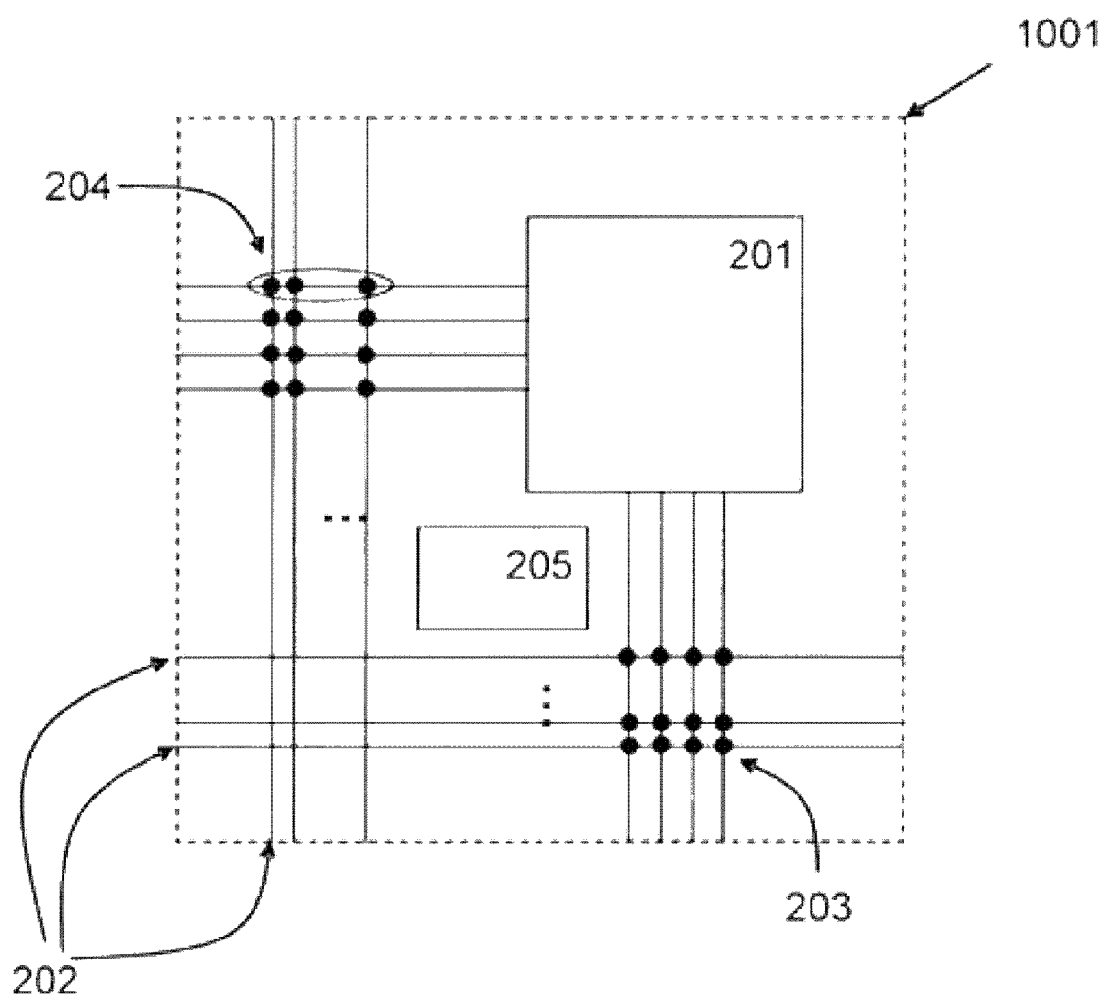
FIG. 2 is a simplified diagram of a tile.

FIG. 2 shows a simplified illustration of a tile 1001, which is one of the tiles 1001a-1001p. The tiles 1001a-1001p have similar structure. In other words, the tile 1001 is a repeating unit of the PLD 1000. The tile 1001 includes a logic block 201, a number of interconnecting lines 202 and a pre-charge driver (PD) 205. The logic block 201 includes logic circuits and at least one D-type flip-flop (D-FF) for holding data. The D-FF can be a part of a scan chain and the D-FF can be tested by conventional scan test. The interconnecting lines are interconnected by programmable interconnect points 203 (PIPs, shown as small dots in FIG. 2). PIPs are often coupled into groups (e.g. group 204) that implement multiplexer circuits selecting one of several interconnecting lines to provide a signal to a destination interconnecting line or the logic block 201. The interconnecting lines 202, the PIPs 203 and group 204 can be a part of routing network. The PIPs 203 are controlled by control signals based on the configuration data stored in a configuration memory block (not shown in FIG. 2).

The configuration memory block comprises a plurality of latch circuits. The PD 205 is physically connected to the interconnecting lines 202.

Figure 3A:
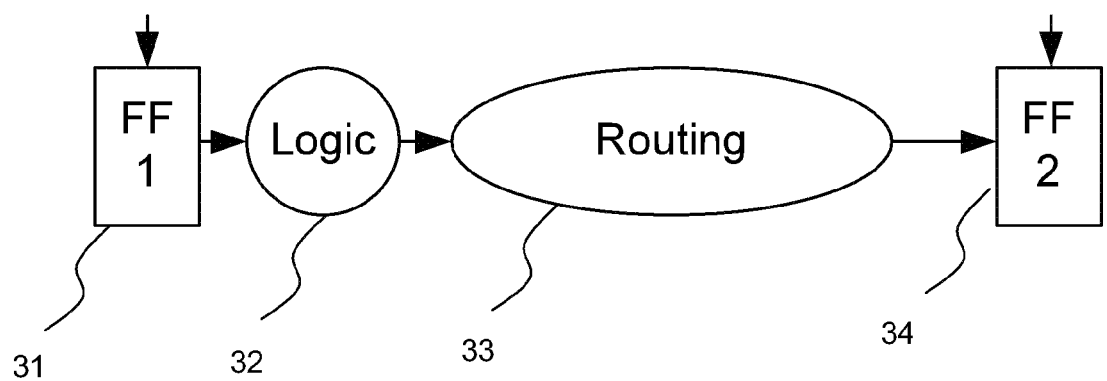
FIG. 3A is a block diagram illustrating a programmable logic device without a pre-charge driver (PD).

An example of hardware arrangement in a programmable logic device without PD 205 shall now be described with reference to FIGS. 3A-3B. As shown in FIG. 3A, a first register FF1 31 is connected to logic unit 32. The logic unit 32 is configured to utilize the data provided by a register FF1 31 and perform operations utilizing the data with its logic circuitry. The processed data can then be passed by the logic unit 32 to an interconnected routing network 33 which directs the transmitted data to a further register FF2 34 associated with, for example, a further logic unit of the programmable logic device.

Figure 3B:
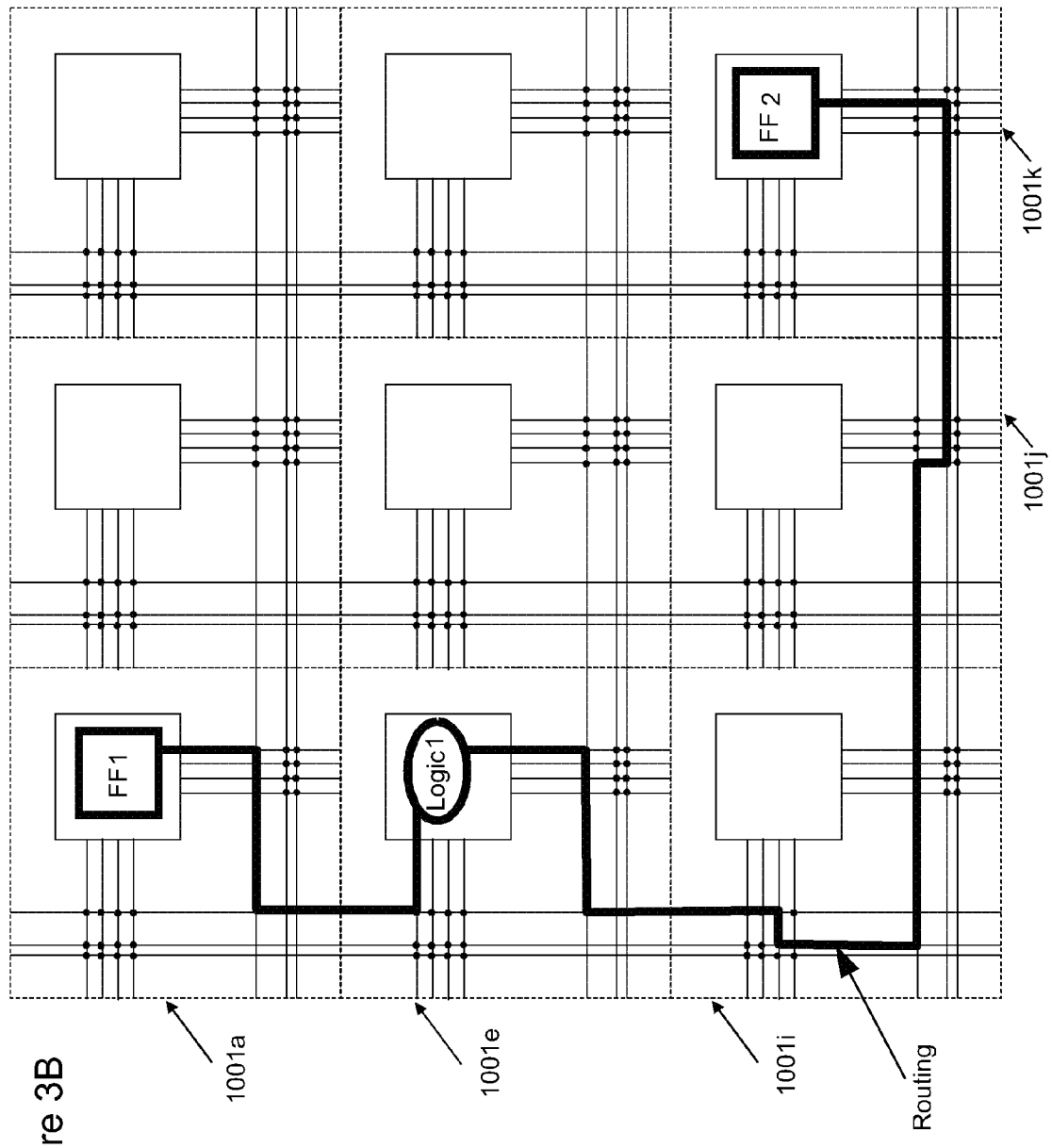
FIG. 3B is a diagram illustrating exemplary implementation of the arrangement of FIG. 3A.

Exemplary implementation of the hardware arrangement of FIG. 3A in PLD 1000 is shown in FIG. 3B. The first register FF1 31 in the tile 1001a is connected to logic unit 32 in the tile 1001e. The processed data can then be passed by the logic unit 32 to the routing network 33 which is in the tile 1001e, 1001i, 1001j and 1001k. The routing network 33 directs the transmitted data to a register FF2 34 in the tile 1001k.

Figure 4A:
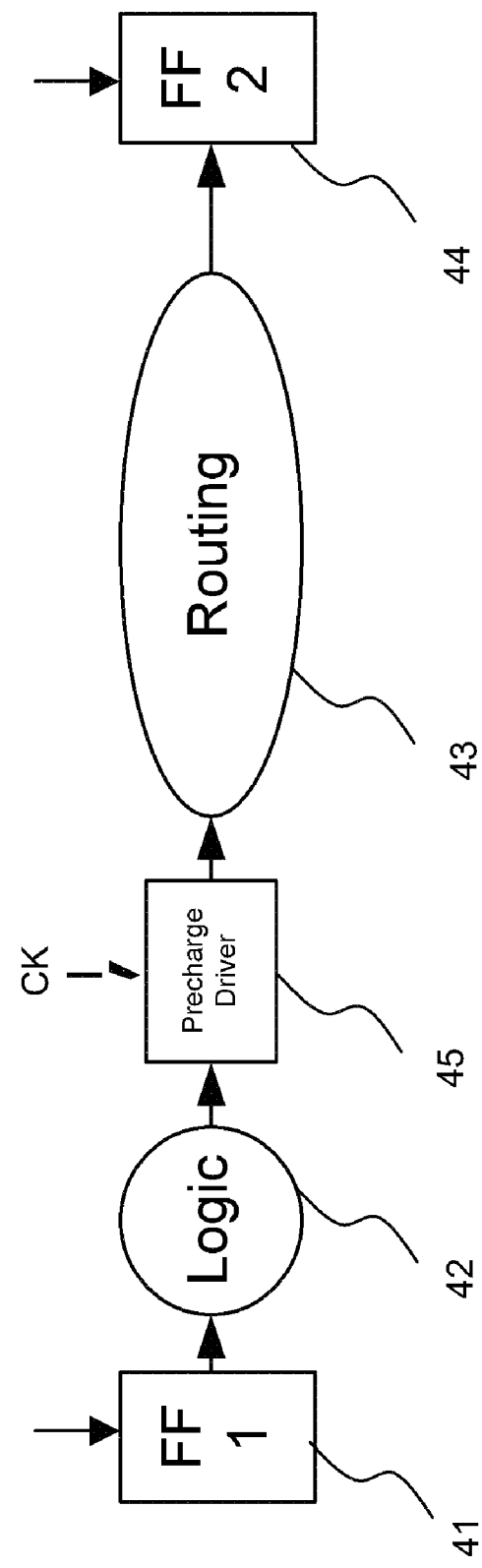
FIG. 4A is a block diagram illustrating a programmable logic device with a PD placed between the output of the logic and the input of the routing network.

Turning now to FIG. 4A, an embodiment is shown in which pre-charge driver circuit 45 is placed between the output of the logic 42 and the input of the routing network 43. As this is a synchronous circuit, a common clock signal is provided to register FF1 41, the pre-charge driver 45 and register FF2 44.

Figure 4B:
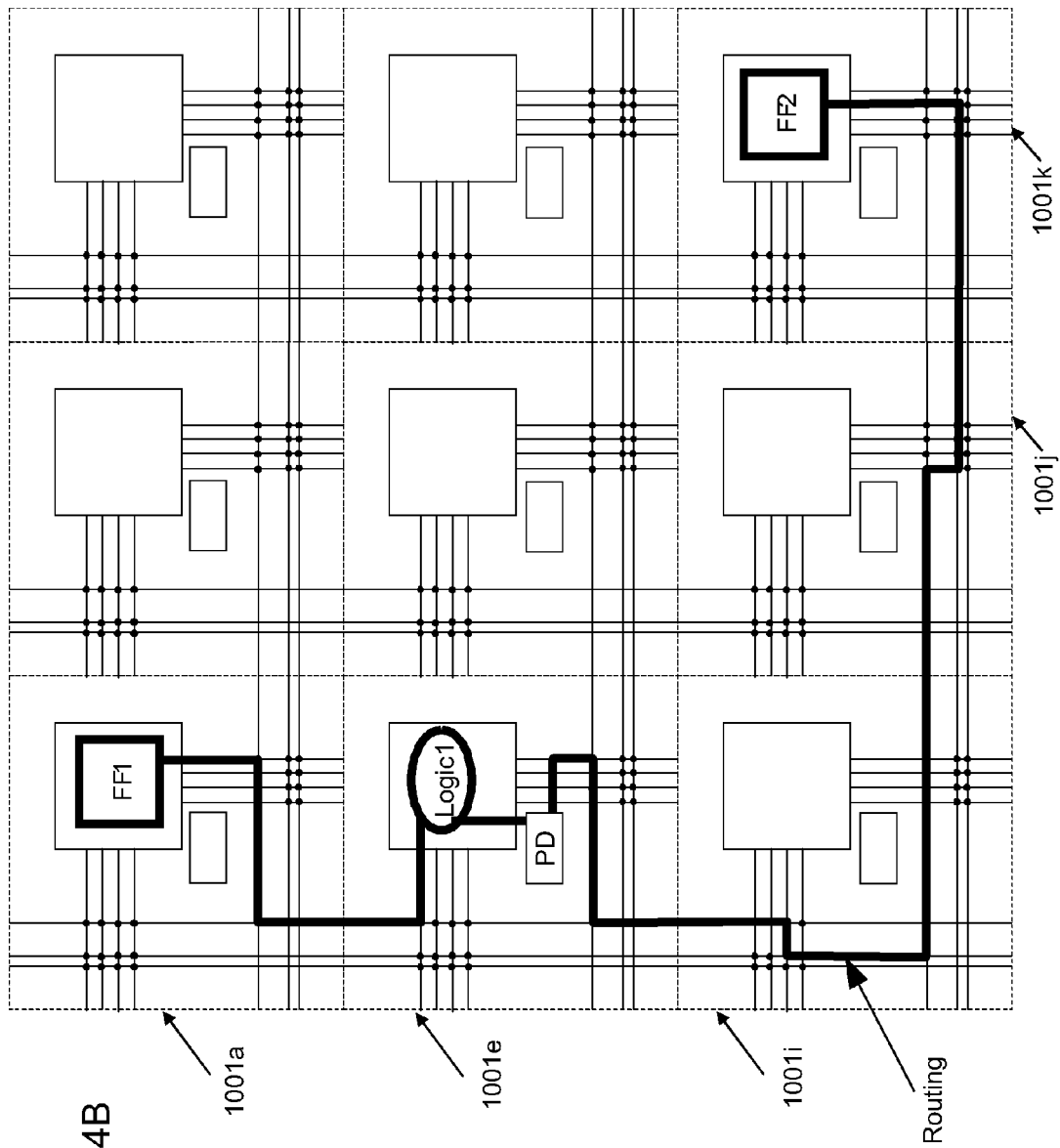
FIG. 4B is a diagram illustrating exemplary implementation of the arrangement of FIG. 4A.

Exemplary implementation of the hardware arrangement of FIG. 4A in PLD 1000 is shown in FIG. 4B. The first register FF1 in the tile 1001a is connected to logic unit in the tile 1001e. The processed data can then be passed by the logic unit to the routing network which is in the tile 1001e, 1001i, 1001j and 1001k via the pre-charge driver circuit in the tile 1001e. The routing network directs the transmitted data to a register FF2 in the tile 1001k.

The routing network 43 of this embodiment can be arranged to exhibit skewed delay such that falling edges (high to low transition) are much faster than rising edges (low to high transition), and also can be arranged to exhibit skewed delay such that rising edges are much faster than falling edges. As will be explained in more detail in the following description, embodiments can take advantage of the faster edges between rising edges and falling edges such that the only limitation to the speed of the routing network is the speed of the falling edges.

The pre-charge driver circuit 45 is controlled by an input signal and provides a specialised output stage to the logic 42. The pre-charge driver circuit 45 provides an output signal which pre-charges the output node and holds it at a predetermined signal value for a period of time starting at the beginning of a clock cycle of the common clock.

Figure 5:
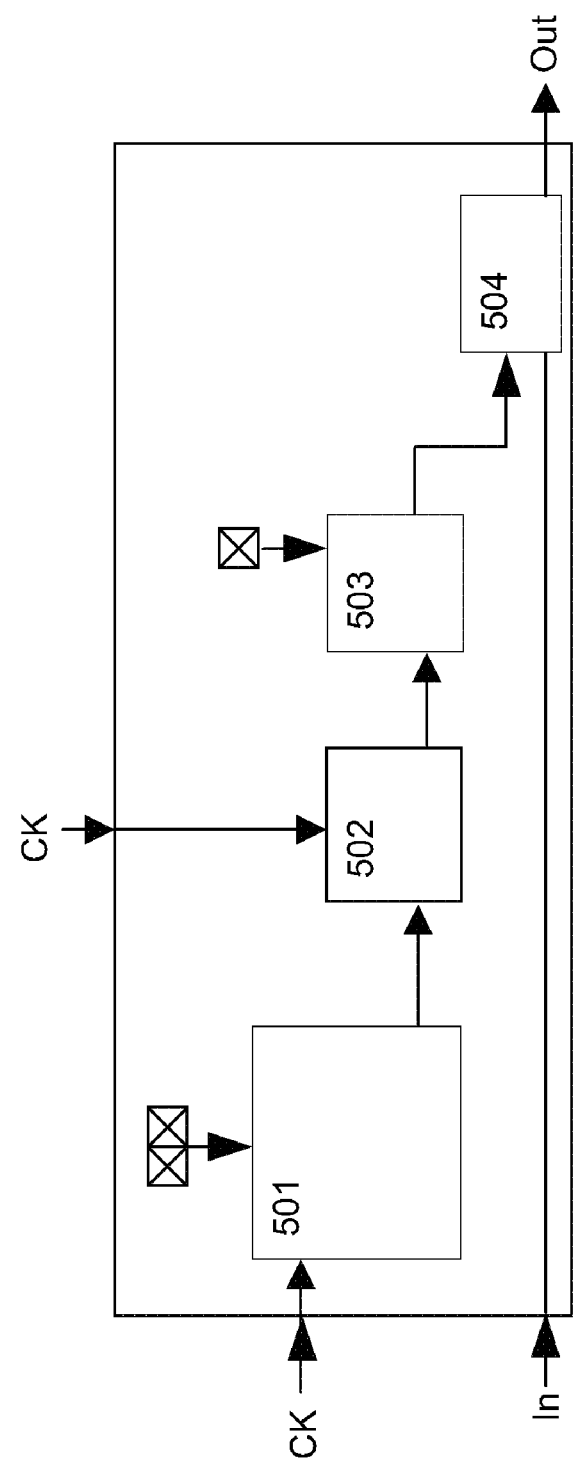
FIG. 5 is block diagram of a PD.

The block diagram of the pre-charge driver 45 is shown in FIG. 5. The pre-charge driver comprises a delayed clock signal generator 501, a pre-charge drive signal generator 502, an enable circuit 503 and an output circuit 504. The delayed clock generator 501 outputs a clock signal with appropriate delay. Configuration bits are connected to the delayed clock generator 501 and allow generation of a clock signal with appropriate delay. The output delayed clock signal and the clock input signal are input to the pre-charge drive signal generator 502. The pre-charge drive signal generator 502 outputs a pre-charge drive signal to the enable circuit 503. The enable circuit 503 can also generate a logical zero to the input of the output circuit 504, according to a further configuration bit which is connected to the enable circuit 503 to allow selection of the pre-charge drive signal or the logical zero. The output of the enable circuit 503 is connected to the output circuit 504. The output circuit 504 also receives an input data signal from the logic and behaves as follows. When the configuration bit is loaded with configuration data such that the logical zero is selected by the enable circuit 503, the pre-charge driver 45 is effectively bypassed and the output circuit 504 outputs the input data signal for the duration of each clock cycle. In contrast, when the configuration bit is loaded so that the output of pre-charge drive signal is selected, the output circuit 504 outputs the pre-charge drive signal to the routing network and then the pre-charge driver can exhibit a mode of behaviour which pre-charges the output node.

Figure 6:
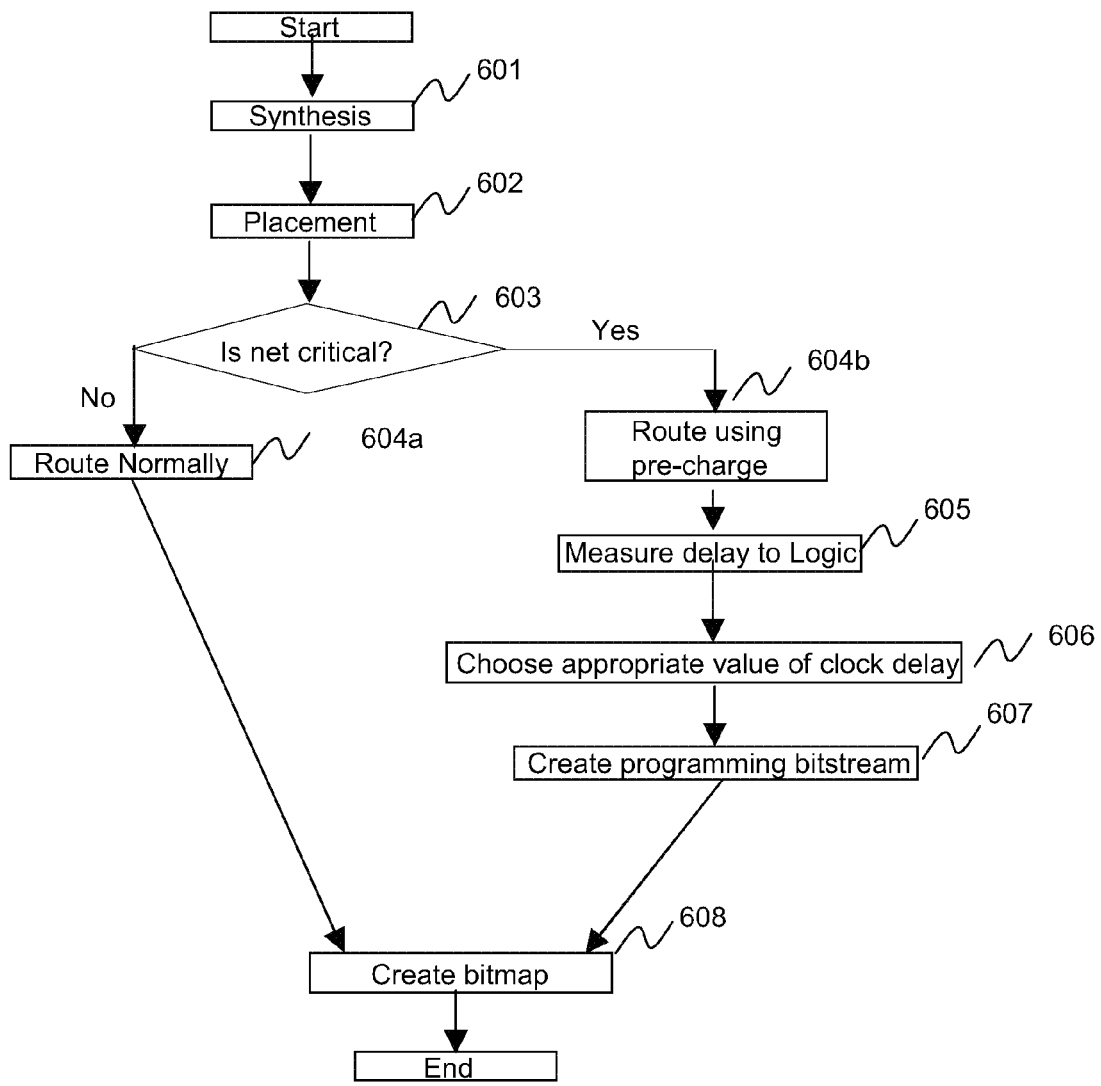
FIG. 6 is a flow diagram illustrating an exemplary procedure for utilizing the PD in a PLD toolchain.

FIG. 6 is a flow chart showing how the pre-charge driver may be utilised in a PLD toolchain arranged to take advantage of the routing speed improvements offered by the pre-charge behaviour. The PLD toolchain is aware of the increased speed of the routing connections and is able to make use of them during the routing phase.

At steps 601 and 602 synthesis of the net list and placement is carried out in a conventional manner. At step 603 the toolchain software makes a determination as to whether a net to be routed is likely to be critical with regards to speed. If the determination is that the net is critical then processing branches to step 604b otherwise processing continues at step 604a, where the net is routed normally.

However, if the net is deemed to be critical, pre-charge routes are used (604b). After routing, the toolchain proceeds to measure the maximum delay to the output signal of the placed logic (step 605). Once this measurement has been made then the tool chain determines at step 606 the smallest value of the selection input to the delayed clock signal generator 501 of the pre-charge driver circuit that will provide a delayed clocked signal delayed by a time greater than the logic delay. In other words, the pre-charge time is set to be equal or greater than the delay to the output signal from the logic.

At step 607 this is implemented in the circuit by creating a programming bit stream with the appropriate values programmed into the configuration bits such that the pre-driver behaviour is active and the determined delay is applied.

Finally, at step 608 the toolchain creates a configuration bitmap which is applied to the PLD to implement the desired routing behaviour.

Embodiment 2

In this embodiment, the exemplary components of the pre-charge driver 45 and its behaviour will be shown in more detail. The routing network 43 of this embodiment is preferably arranged to exhibit skewed delay such that falling edges are much faster than rising edges. For example, (i) nMOS transistors, (ii) standard cell gates with biased transistors to make one edge faster than the other, or (iii) pass gate CMOS switches that have a property in which falling edges are faster than rising edges. As will be explained in more detail in the following description, embodiments can take advantage of the fast falling edges such that the only limitation to the speed of the routing network is the speed of the falling edges.

Figure 7A:
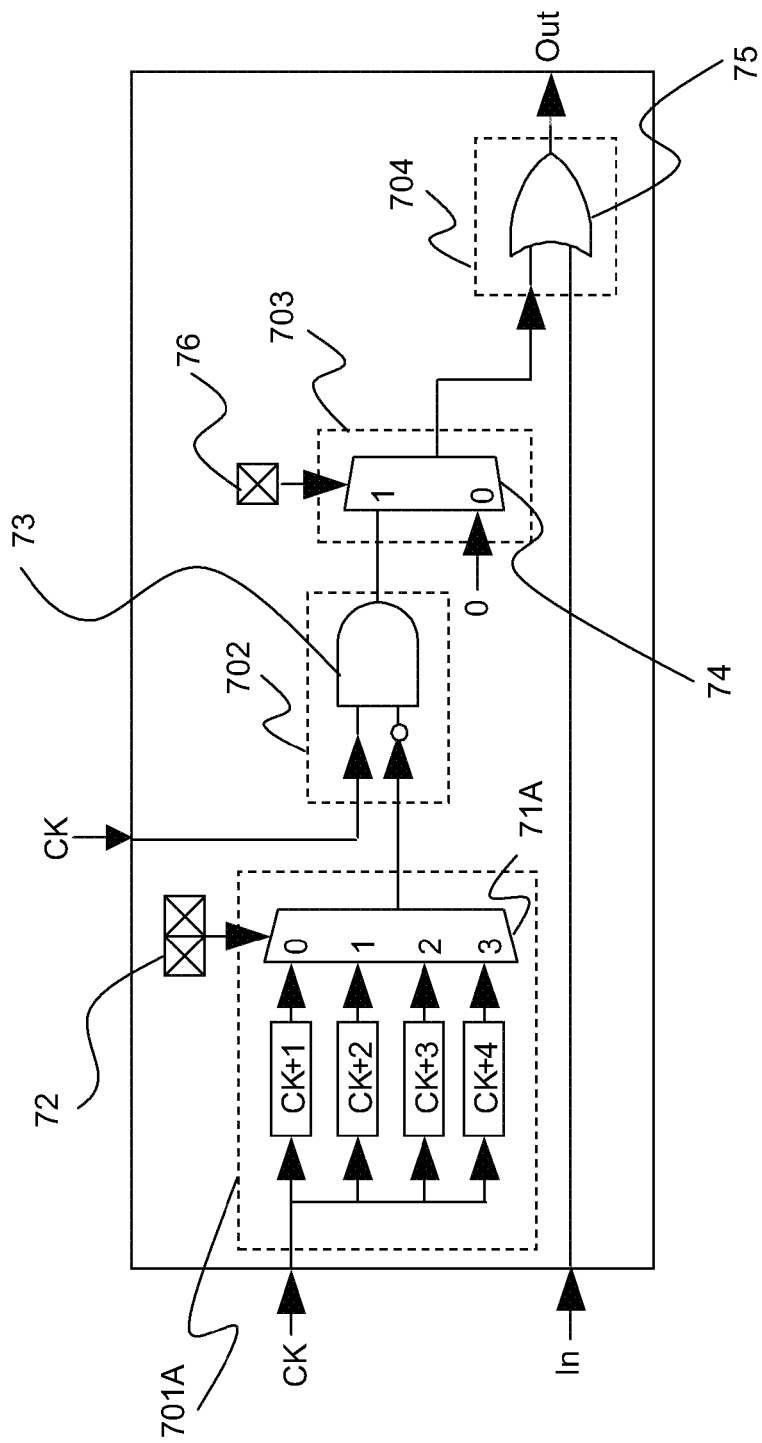
FIG. 7A is a diagram of a PD according to a second embodiment.

As shown in the FIG. 7A, the pre-charge driver 45 comprises a delayed clock signal generator 701A, a pre-charge drive signal generator 702, an enable circuit 703 and an output circuit 704.

The delayed clock signal generator 701A comprises a multiplexer 71A (selecting device) and four local delay units CK+1, CK+2, CK+3 and CK+4. The clock input signal 'CK' is provided to the four local delay units CK+1, CK+2, CK+3 and CK+4 which are configured to generate a delayed version of the input clock signal 'CK', 'CK'+1 ns, 'CK'+2 ns, 'CK'+3 ns, 'CK'+4 ns respectively. The outputs of the delay units CK+1 to CK+4 are connected as inputs 0 to 3 of multiplexer 71A. Configuration bits 72 are connected to the selection input(s) of the multiplexer 71A and allow selection of any one of the delayed clock signals.

Figure 7B:
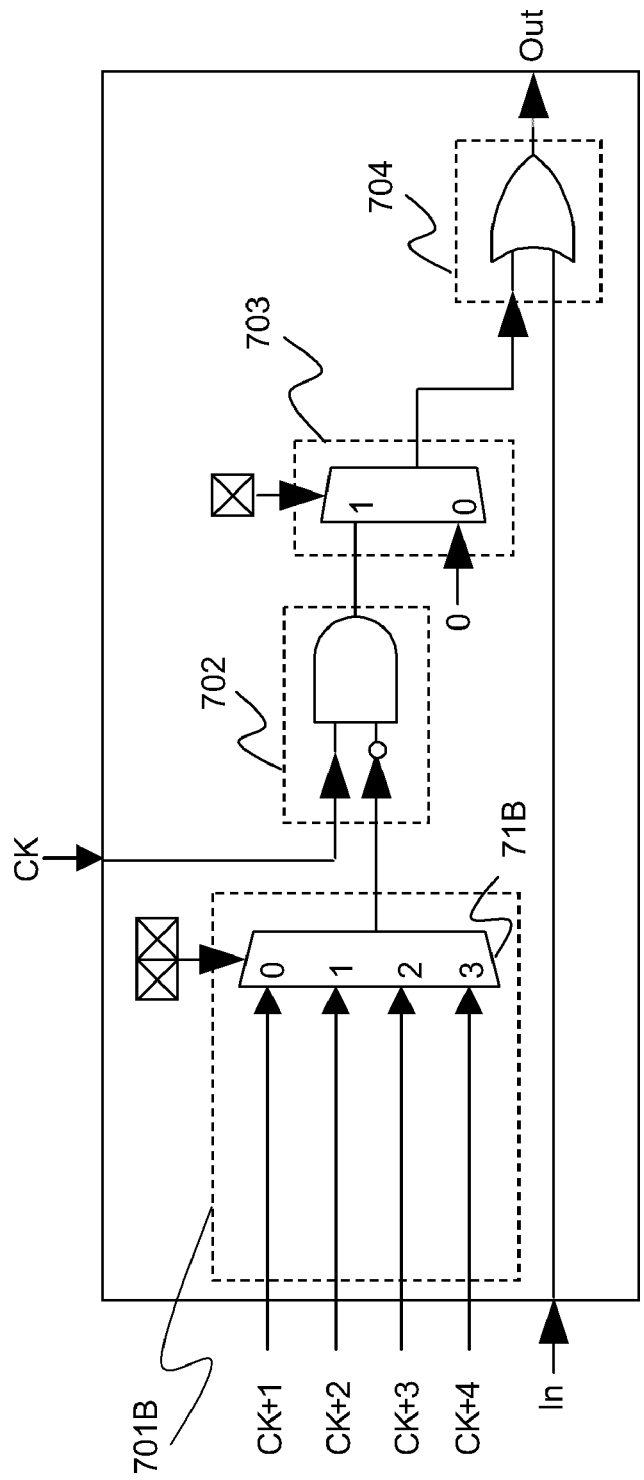
FIG. 7B is a diagram of a PD according to a modification to the second embodiment.

FIG. 7B shows another delayed clock signal generator 701B. The difference is that 'CK'+1 ns, 'CK'+2 ns, 'CK'+3 ns and 'CK'+4 ns are provided from outside of the pre-charge driver 45 and are input into a multiplexer 71B. Other parts of the pre-charge driver 45 are similar to that of FIG. 7A.

Returning to FIG. 7A, the pre-charge drive signal generator 702 comprises an AND-gate 73 which utilises the delayed and non-delayed clock signals to output a pre-charge drive signal. The delayed signal at the output of the multiplexer 71A is provided to an inverting input of AND-gate 73. The non-delayed clock signal 'CK' is provided at a non-inverting input of the AND-gate 73.

Figure 7C:
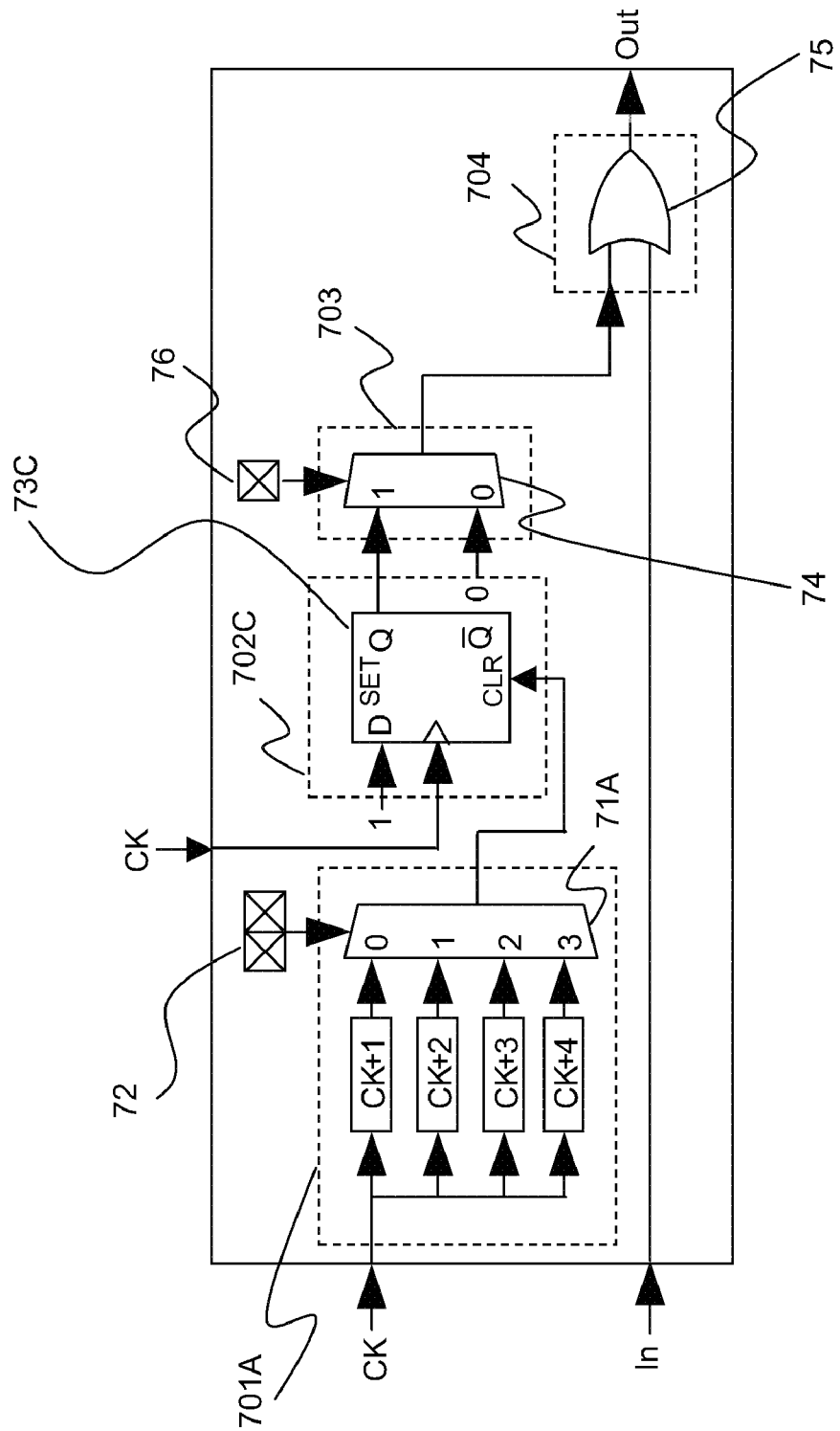
FIG. 7C is a diagram of a PD according to a modification to the second embodiment.

FIG. 7C shows another pre-charge drive signal generator 702C which comprises a DQ flip-flop 73C, which outputs a pre-charge control signal.

Returning to FIG. 7A, the enable circuit 703 comprises a further multiplexer 74. The output of the AND-gate 73 is connected to a first input of the multiplexer 74. A second input of the multiplexer 74 is connected to a signal source providing a signal value representative of a logical zero.

The output circuit 704 comprises an OR-gate 75. The output of the multiplexer 74 is connected to a first input of OR-gate 75, while the signal input to the pre-charge driver is provided to a second input of the OR-gate 75. The pre-charge driver 45 output 'Out' is provided to the routing network by the output of OR-gate 75. A further configuration bit 76 is provided which is connected to the multiplexer 74 to allow selection of the pre-charge drive signal output from the AND-gate 73 or the logical zero. When the configuration bit 76 is loaded with configuration data such that the logical zero is selected by multiplexer 74, the pre-charge driver 45 is effectively bypassed and the input to the pre-charge driver is connected directly to the output for the duration of each clock cycle. In contrast, when the configuration bit 76 is loaded so that the output of AND-gate 73 is selected, then the pre-charge driver can exhibit a mode of behaviour which pre-charges the output node.

By loading appropriate configuration data to configuration bits 72 the multiplexer 71A can be configured to select one of a suitably delayed version of the clock signal and as a consequence, the output of the AND-gate unit 73 which has the non-delayed clock signal as its other input will provide a logical one at its output during an initial period of each clock cycle; the initial period being equal to the delay time applied to the clock signal selected by the multiplexer 71A.

When the pre-charge driver is operational, the configuration bit 76 is set to select the first input of the multiplexer 74 and thus allows the output of the AND-gate 73 to propagate to the OR-gate 75. Accordingly, in this example, the first input of the OR-gate 75 will be charged to and held at a logical 1 for the selected 1, 2, 3 or 4 ns of each clock cycle and accordingly the output of the pre-charge driver will also be at a logical 1 for the first 1 to 4 ns of a clock cycle. This pre-charge is the output node and holds it at the logical 1 for the first 1 to 4 ns of its clock cycle. After this period the output of the AND-gate 73 drops to zero and accordingly, the first input to the OR-gate 75 also drops to zero. The output node during this period becomes controlled directly by the signal provided at the input to the pre-charge driver.

Figure 8:
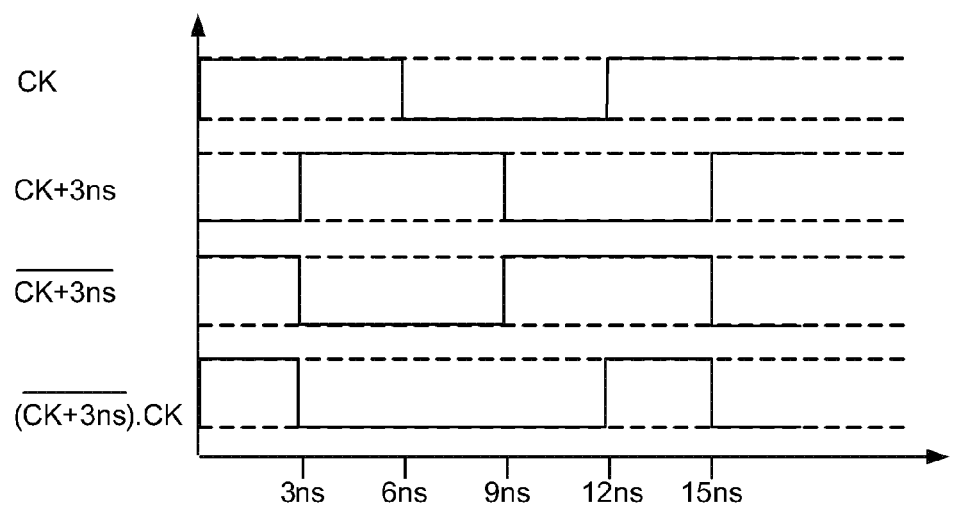
FIG. 8 is a diagram illustrating signal values at different points in the PD

The signal inputs and outputs of the AND-gate 73 are shown in FIG. 8 to clarify operation of the circuit. In this example, it is assumed that the third input (labelled '2' on FIG. 7A) of the multiplexer 71A has been selected and accordingly, a clock signal delayed by 3 ns is provided to the converting input of the AND-gate 73. The first plot shows the value of CK during an example number of periods (of 12 ns each) while the second plot shows CK+3 which shows the clock signal 'CK' delayed by 3 ns provided to the second input of the multiplexer 71A by local signal generator CK+3. Beneath this the inverse of the delayed clock signal is shown which would be provided as the second input to the AND-gate 73. Finally, the last plot shows the output of the AND-gate 73. As can be clearly seen from the timing diagram CK and $\overline{CK+3}$ are both high for the first 3 ns of each clock cycle. Accordingly, the output of the AND-gate is high during the first 3 ns of a clock cycle. Operation of the pre-charge driver whereby the input signal drops from high to low, rises from low to high, stays high and stays low is shown in the timing diagrams of FIGS. 9A, 9B, 9C and 9D respectively. In each example, the logic circuitry preceding the pre-charge driver is assumed to have a maximum delay of 2.8 ns and the second input of the multiplexer 71A has been selected to provide a clock delay of 3 ns such that the pre-charge driver pre-charges or holds the output node connector to the routing network high for the first 3 ns after the beginning of each clock cycle.

Figure 9A:
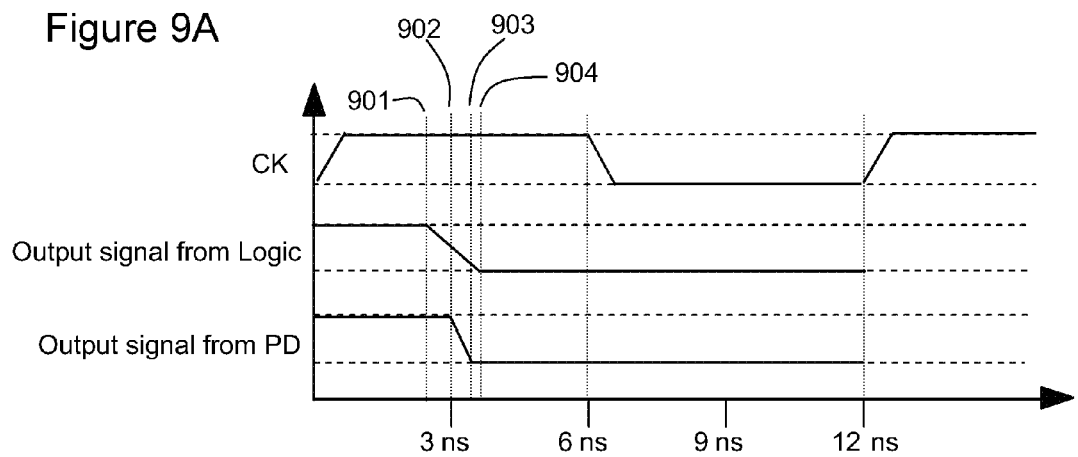
FIGS. 9A-9D are timing diagrams showing operation of the PD during different input signals.

FIG. 9A shows a timing diagram of the clock signal provided to the pre-charge driver 45, the input to the pre-charge driver provided from the logic circuit 32 and the output node of the pre-charge driver 45 which is connected to the routing network 42. It is assumed that the configuration bit 76 is set to logic 1 such that the signal from the AND-gate 73 is arranged to propagate to the OR-gate 75 thereby controlling the output of the pre-charge driver 45. In FIG. 9A the input to the pre-charge driver 45 falls from a high signal value to a low signal value (e.g. H->L from a signal representing logical 1 to a logical 0). As the input to the pre-charge driver 45 has previously been high then the output to the pre-charge driver 45 at the beginning of the clock cycle will also be high. As described above the pre-charge driver 45 holds its output high until 3 ns from the beginning of the clock cycle (i.e. for the delay provided to the clock signal provided at the inverting input of the AND-gate 73). At time 901 the input signal provided by the logic circuit begins to fall, however, the output of the pre-charge driver is held at a high value until time 902 corresponding to 3 ns, at which point the output of the AND-gate 73 falls to zero and correspondingly the output of the pre-charge driver begins to follow the input signal. As the routing network is skewed such that falling edges are faster than standard falling edges, the routing delay for a falling edge is reduced when compared to a routing delay for a falling edge in a non-skewed routing network.

Figure 9B:
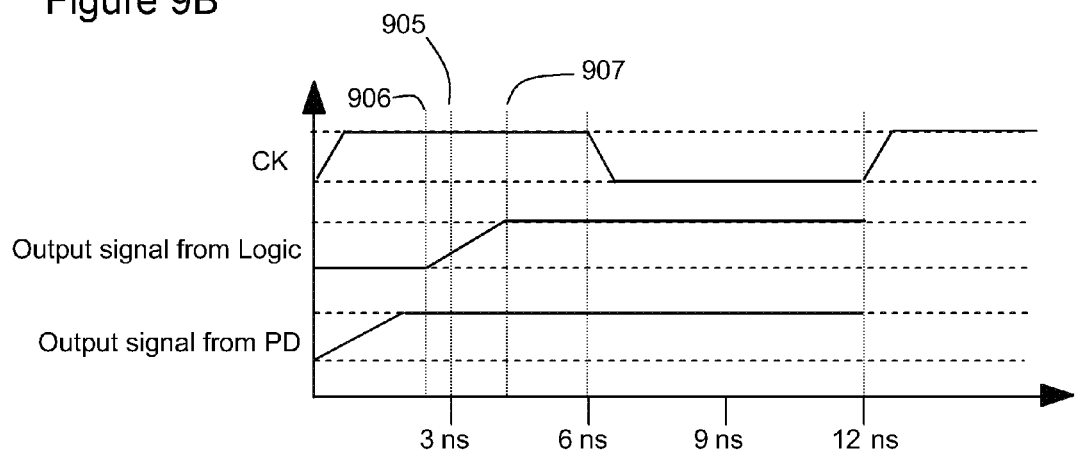

FIG. 9B goes on to show a situation of a signal edge where the input goes from a low value to a high value (L->H). As the preceding input value was low at the beginning of the clock cycle, both the pre-charge driver input and output has a low value. However, the pre-charge driver immediately begins to pre-charge its output value to high signal where it is held high until the time 905 corresponding to 3 ns. During this time, at 906 there is a rising edge at the input of the pre-charge driver which reaches a high value at 907. However, at this time, the pre-charge driver has already pre-charged a high signal value and at the time 905 where the pre-charge driver switches to the signal input, the pre-charge driver output is merely held high by pre-charge driver input. As the routing network is skewed such that rising edges are slower than standard rising edges, the routing delay for a rising edge would be increased when compared to a routing delay for a rising edge in a non-skewed routing network. However the pre-charge driver is already holding the output high so no rising edge occurs.

Figure 9C:
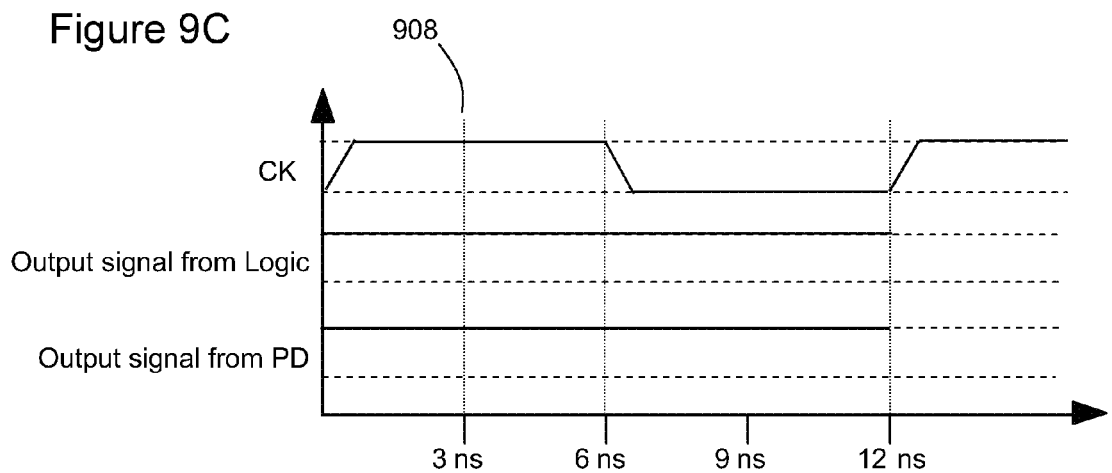

A similar type of behaviour occurs where there is no transition and the signal is held high upon the beginning of a new clock cycle at the input to the pre-charge driver (H->H) as shown in FIG. 9C. In this situation, at the beginning of the clock cycle, the pre-charge driver input and the pre-charge driver output are at the high signal level, the pre-charge driver output is held high by the pre-charge driver circuit for the first 3 ns. However, upon switching control of the pre-charge driver output to the pre-charge driver input at 908, it remains high because the pre-charge driver input signal is also high. Accordingly, for this type of transition, both the pre-charge driver input and output signals stay high throughout the clock cycle.

Figure 9D:
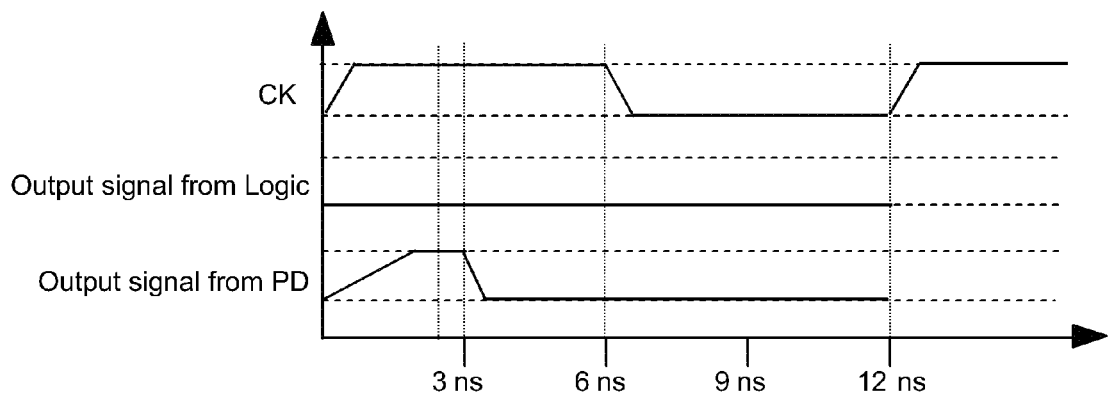

Finally, FIG. 9D shows the most complex behaviour exhibited by the pre-charge driver circuit. This is where there is no transition at the pre-charge driver input and the pre-charge driver input signal is held low (L->L). In this situation, at the beginning of the clock cycle, the pre-charge driver output is pre-charged as before to the high signal value and held at this value until 3 ns from the beginning of the clock cycle. At this point, the output of the pre-charge driver follows the pre-charge driver input which is held low. Accordingly, the output of the pre-charge driver 45 begins to fall until it reaches the low signal value. As long as the input is maintained low then the output of the pre-charge driver will speculatively oscillate between a high and low value. As shown there is delay in responding to the low signal at the input at 2.8 ns (the maximum delay of the input signal) and switching to follow the input of the pre-charge driver. This is in part compensated by careful design of the routing network to ensure a fast falling edge. In addition, the pre-charging behaviour also has the disadvantage of consuming additional power due to the continual charging and discharging of the signal at the beginning of each clock cycle. However, depending on the device, this disadvantage may be outweighed by careful design and application of the pre-charge driver to the reduction in the delays of the longer paths of interconnects in the routing network.

In an alternative embodiment, the programmable logic device can be configured such that the default state of the logic is for the signal to be held high, thus reducing the number of incidences where there would be pumping with its associated power cost by the pre-charged driver. By designing in this way it may be possible to reduce the additional power consumption burden of the pre-charge driver.

In summary, by carefully choosing the rising and falling delays in the routing network, such that the falling edge is much faster than the rising edges together with appropriate configuration of the delay in the pre-charge driver to ensure that it is at least equal to if not greater than the delay by the preceding logic, it is possible to obtain improvements in the overall circuit speed. It is a property of the described circuit that the delay of the falling edges becomes the only limiting factor to the speed of the routing network.

In particular, by inspecting the four timing diagrams shown in FIGS. 9A, 9B, 9C and 9D it is apparent that the rising edges on the pre-charge driver output always start at the beginning of a clock cycle, and therefore do not need to be made fast. This allows the routing network design to focus on the speed of falling edges, creating a faster overall solution.

In the above described embodiment the clock is derived by having a multiplexer choose one of a number of delayed versions of a clock which are all generated locally by signal generators CK+1 to CK+4. In an alternative embodiment, however, a programmable delay can be utilized instead of a multiplexer.

In the above embodiments, the pre-charge driver circuit has been described as being applicable to programmable logic devices but as will be appreciated, it can be applied to any type of programmable device where routing is required between logic units. For example, the pre-charge driver could equally be applied to a fully programmable gate array.

In the above described embodiment the multiplexer 71A has four inputs corresponding to a pre-charge time of 1-4 ns. As will be appreciated more than four inputs can be utilised by the multiplexer and the granularity (i.e. the difference) between the selectable delays can be arbitrarily selected according to the design considerations for a particular circuit. In general by provided increased granularity and/or range of the delayed clock signals selectable by the multiplexer the programmable device has more flexibility and can be more efficiently configured to match the delay of the preceding logic circuitry providing the signal to be routed.

Embodiment 3

Figure 10A:
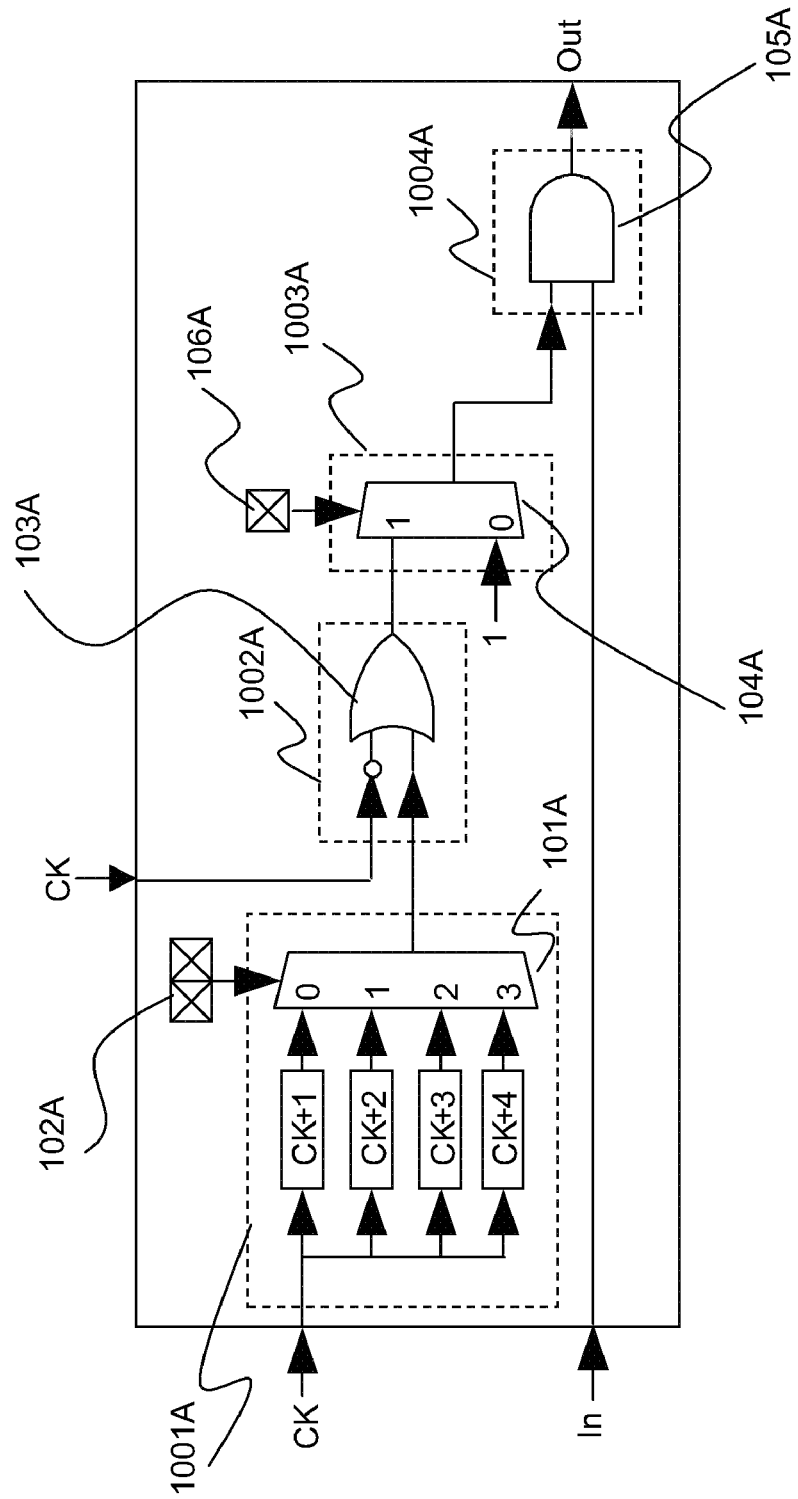
FIG. 10A is a diagram of a PD according to a third embodiment.
Figure 10B:
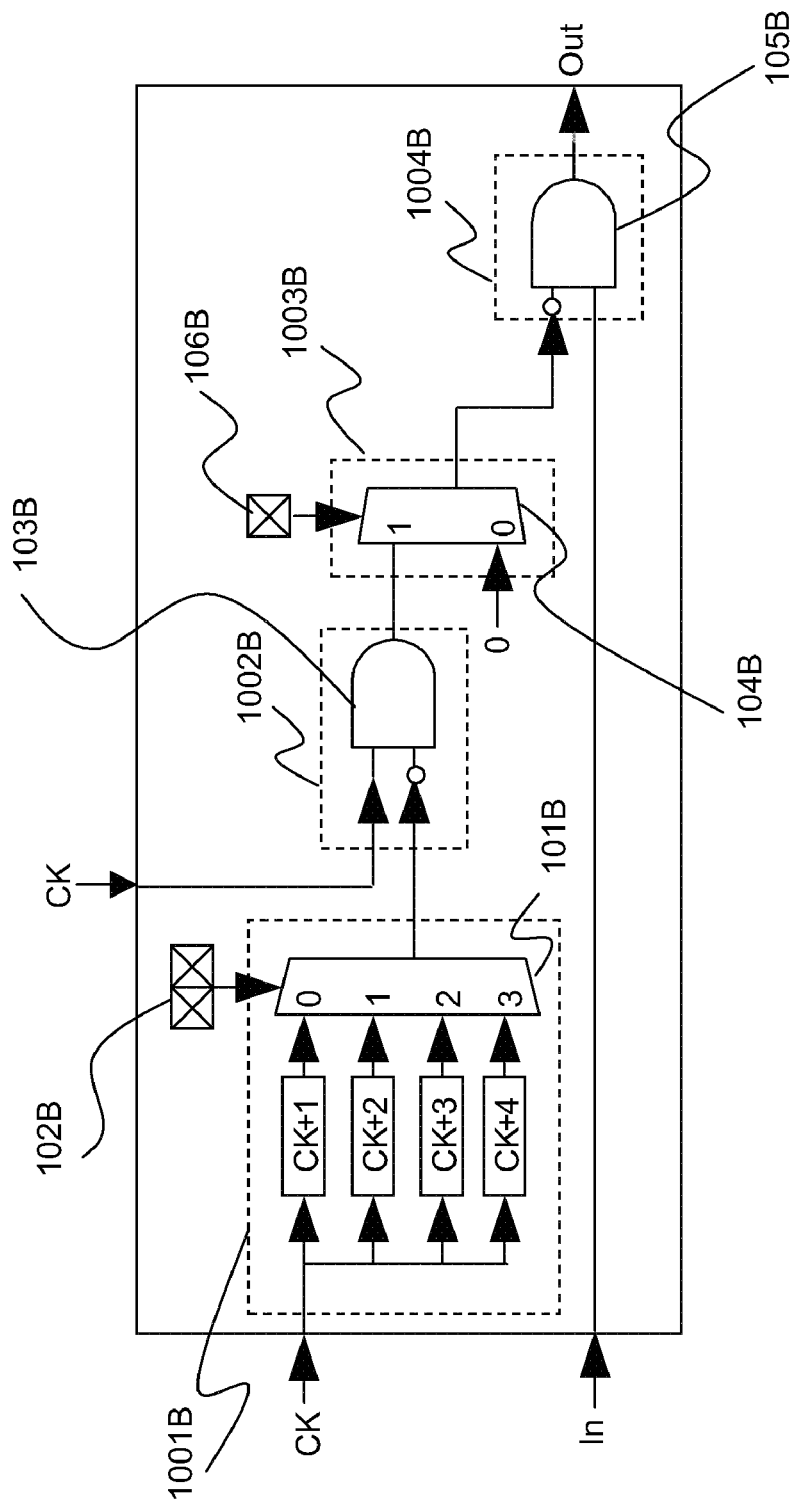
FIG. 10B is a diagram of a PD according to a modification to the third embodiment.
Figure 10C:
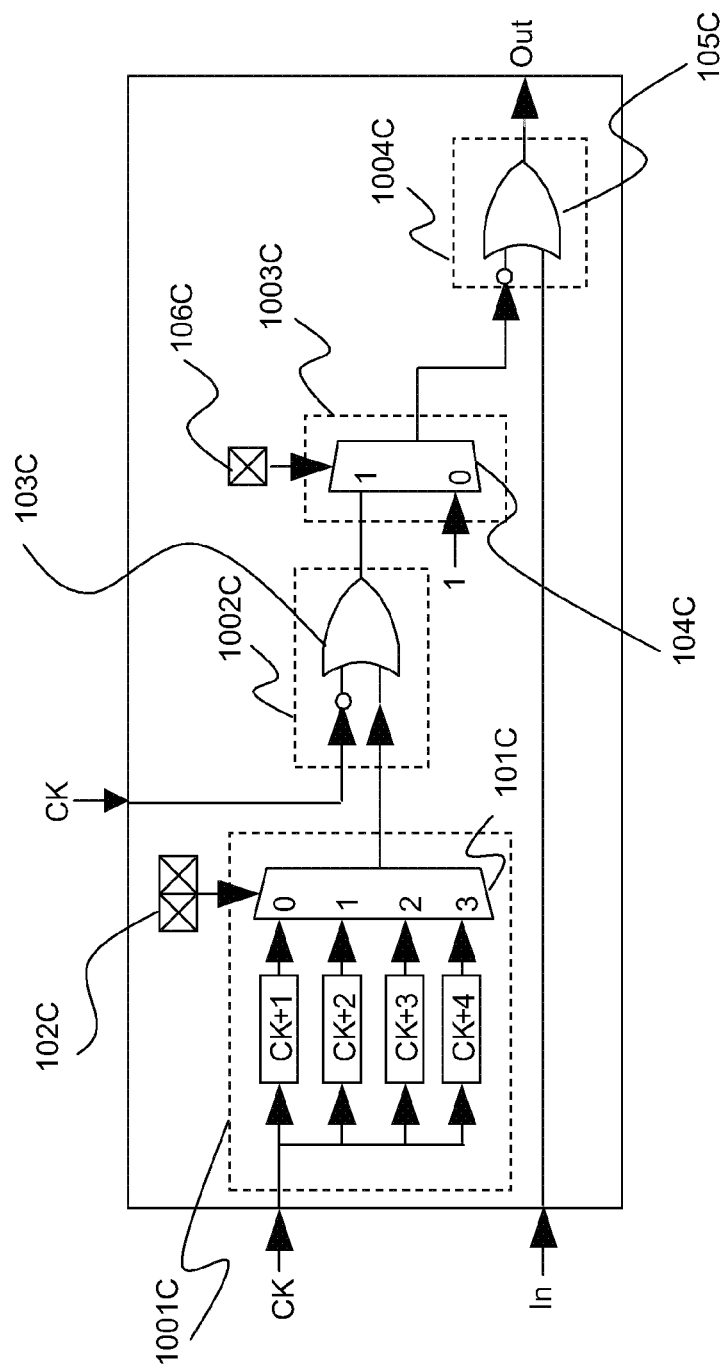
FIG. 10C is a diagram of a PD according to a modification to the third embodiment.

FIGS. 10A-10C show other exemplary components of the pre-charge driver 45.

The routing network 43 to which the pre-charge driver shown in FIG. 10A is applied is preferably arranged to exhibit skewed delay such that rising edges are much faster than falling edges. As will be explained in more detail in the following description, this embodiment takes advantage of the fast rising edges such that the only limitation to the speed of the routing network is the speed of the rising edges.

As shown in the FIG. 10A, the pre-charge driver 45 comprises a delayed clock signal generator 1001A, a pre-charge drive signal generator 1002A, an enable circuit 1003A and an output circuit 1004A.

The delayed clock signal generator 1001A comprises a multiplexer 101A and four local delay units CK+1, CK+2, CK+3 and CK+4. The clock input signal 'CK' is provided to the four local delay units CK+1, CK+2, CK+3 and CK+4 which are configured to generate a delayed version of the input clock signal 'CK', 'CK'+1 ns, 'CK'+2 ns, 'CK'+3 ns, 'CK'+4 ns respectively. The outputs of the delay units CK+1 to CK+4 are connected as inputs 0 to 3 of multiplexer 101A. Configuration bits 102A are connected to the selection input (s) of the multiplexer 101A and allow selection of any one of the delayed clock signals.

The pre-charge drive signal generator 1002A comprises an OR-gate 103A which utilises the delayed and non-delayed clock signals to output a pre-charge drive signal. The delayed signal at the output of the multiplexer 101A is provided to a non-inverting input of OR-gate 103A. The non-delayed clock signal 'CK' is provided at an inverting input of the OR-gate 103A.

The enable circuit 1003A comprises a further multiplexer 104A. The output of OR-gate 103A is connected to a first input of the multiplexer 104A. A second input of the multiplexer 104A is connected to a signal source providing a signal value representative of a logical one.

The output circuit 1004A comprises an AND-gate 105A. The output of the multiplexer 104A is connected to a first input of AND-gate 105A, while the signal input to the pre-charge driver is provided to a second input of the AND-gate 105A. The pre-charge driver 45 output 'Out' is provided to the routing network by the output of AND-gate 105A. A further configuration bit 106A is provided which is connected to the multiplexer 104A to allow selection of the pre-charge drive signal output from the OR-gate 103A or the logical one. When the configuration bit 106A is loaded with configuration data such that the logical one is selected by multiplexer 104A, the pre-charge driver 45 is effectively bypassed and the input to the pre-charge driver is connected directly to the output for the duration of each clock cycle. In contrast, when the configuration bit 106A is loaded so that the output of OR-gate 103A is selected then the pre-charge driver can exhibit a mode of behaviour which pre-charges the output node.

By loading appropriate configuration data to configuration bits 102A the multiplexer 101A can be configured to select one of a suitably delayed version of the clock signal and as a consequence, the output of the OR-gate 103A which has the non-delayed clock signal as its other input will provide a logical one at its output during an initial period of each clock cycle the initial period being equal to the delay time applied to the clock signal selected by the multiplexer 101A.

When the pre-charge driver is operational, the configuration bit 106A is set to select the first input of the multiplexer 104A and thus allows the output of the OR-gate 103A to propagate to the AND-gate 105A. Accordingly, in this example, the first input of the AND-gate 105A will be charged to and held at a logical zero for the selected 1, 2, 3 or 4 ns of each clock cycle and accordingly the output of the pre-charge driver will also be at a logical zero for the first 1 to 4 ns of a clock cycle. This pre-charge is the output node and holds it at the logical zero for the first 1 to 4 ns of its clock cycle. After this period the output of the OR-gate 103A rises to logical 1 and accordingly, the first input to the AND-gate 105A also rises to logical 1. The output node during this period becomes controlled directly by the signal provided at the input to the pre-charge driver.

The routing network 43 to which the pre-charge driver shown in FIG. 10B is applied is preferably arranged to exhibit skewed delay such that rising edges are much faster than falling edges. As will be explained in more detail in the following description, this embodiment takes advantage of the fast rising edges such that the only limitation to the speed of the routing network is the speed of the rising edges.

As shown in the FIG. 10B, the pre-charge driver 45 comprises a delayed clock signal generator 1001B, a pre-charge drive signal generator 1002B, an enable circuit 1003B and an output circuit 1004B.

The delayed clock signal generator 1001B comprises a multiplexer 101B and four local delay units CK+1, CK+2, CK+3 and CK+4. The clock input signal 'CK' is provided to the four local delay units CK+1, CK+2, CK+3 and CK+4 which are configured to generate a delayed version of the input clock signal 'CK', 'CK'+1 ns, 'CK'+2 ns, 'CK'+3 ns, 'CK'+4 ns respectively. The outputs of the delay units CK+1 to CK+4 are connected as inputs 0 to 3 of multiplexer 101B. Configuration bits 102B are connected to the selection input (s) of the multiplexer 101B and allow selection of any one of the delayed clock signals.

The pre-charge drive signal generator 1002B comprises an AND-gate 103B which utilises the delayed and non-delayed clock signals to output a pre-charge drive signal. The delayed signal at the output of the multiplexer 101B is provided to an inverting input of AND-gate 103B. The non-delayed clock signal 'CK' is provided at a non-inverting input of the AND-gate 103B.

The enable circuit 1003B comprises a further multiplexer 104B. The output of AND-gate 103B is connected to a first input of the multiplexer 104B. A second input of the multiplexer 104B is connected to a signal source providing a signal value representative of a logical zero.

The output circuit 1004B comprises an AND-gate 105B. The output of the multiplexer 104B is connected to a first input of AND-gate 105B, while the signal input to the pre-charge driver is provided to a second input of the AND-gate 105B. The pre-charge driver 45 output 'Out' is provided to the routing network by the output of AND-gate 105B. A further configuration bit 106B is provided which is connected to the multiplexer 104B to allow selection of the pre-charge drive signal output from the AND-gate 103B or the logical zero. When the configuration bit 106B is loaded with configuration data such that the logical zero is selected by multiplexer 104B, the pre-charge driver 45 is effectively bypassed and the input to the pre-charge driver is connected directly to the output for the duration of each clock cycle. In contrast, when the configuration bit 106B is loaded so that the output of AND-gate 103B is selected then the pre-charge driver can exhibit a mode of behaviour which pre-charges the output node.

By loading appropriate configuration data to configuration bits 102B the multiplexer 101B can be configured to select one of a suitably delayed version of the clock signal and as a consequence, the output of the AND-gate 103B which has the non-delayed clock signal as its other input will provide a logical one at its output during an initial period of each clock cycle, the initial period being equal to the delay time applied to the clock signal selected by the multiplexer 101B.

When the pre-charge driver is operational, the configuration bit 106B is set to select the first input of the multiplexer 104B and thus allows the output of the AND-gate 103B to propagate to the AND-gate 105B. Accordingly, in this example, the first input of the AND-gate 105B will be charged to and held at a logical zero for the selected 1, 2, 3 or 4 ns of each clock cycle and accordingly the output of the pre-charge driver will also be at a logical zero for the first 1 to 4 ns of a clock cycle. This pre-charge is the output node and holds it at the logical zero for the first 1 to 4 ns of its clock cycle. After this period the output of the AND-gate 103B rises to logical 1 and accordingly, the first input to the AND-gate 105B also rises to logical 1. The output node during this period becomes controlled directly by the signal provided at the input to the pre-charge driver.

The routing network 43 to which the pre-charge driver shown in FIG. 10C is applied is preferably arranged to exhibit skewed delay such that falling edges are much faster than rising edges. As will be explained in more detail in the following description, this embodiment takes advantage of the fast falling edges such that the only limitation to the speed of the routing network is the speed of the falling edges.

As shown in the FIG. 10C, the pre-charge driver 45 comprises a delayed clock signal generator 1001C, a pre-charge drive signal generator 1002C, an enable circuit 1003C and an output circuit 1004C.

The delayed clock signal generator 1001C comprises a multiplexer 101C and four local delay units CK+1, CK+2, CK+3 and CK+4. The clock input signal 'CK' is provided to the four local delay units CK+1, CK+2, CK+3 and CK+4 which are configured to generate a delayed version of the input clock signal 'CK', 'CK'+1 ns, 'CK'+2 ns, 'CK'+3 ns, 'CK'+4 ns respectively. The outputs of the delay units CK+1 to CK+4 are connected as inputs 0 to 3 of multiplexer 101C. Configuration bits 102C are connected to the selection input (s) of the multiplexer 101C and allow selection of any one of the delayed clock signals.

The pre-charge drive signal generator 1002C comprises an OR-gate 103C which utilises the delayed and non-delayed clock signals to output a pre-charge drive signal. The delayed signal at the output of the multiplexer 101C is provided to a non-inverting input of OR-gate 103C. The non-delayed clock signal 'CK' is provided at an inverting input of the OR-gate 103C.

The enable circuit 1003C comprises a further multiplexer 104C. The output of OR-gate 103C is connected to a first input of the multiplexer 104C. A second input of the multiplexer 104C is connected to a signal source providing a signal value representative of a logical one.

The output circuit 1004C comprises an OR-gate 105C. The output of the multiplexer 104C is connected to a first input of OR-gate 105C, while the signal input to the pre-charge driver is provided to a second input of the OR-gate 105C. The pre-charge driver 45 output 'Out' is provided to the routing network by the output of OR-gate 105C. A further configuration bit 106C is provided which is connected to the multiplexer 104C to allow selection of the pre-charge drive signal output from the OR-gate 103C or the logical one. When the configuration bit 106C is loaded with configuration data such that the logical one is selected by multiplexer 104C, the pre-charge driver 45 is effectively bypassed and the input to the pre-charge driver is connected directly to the output for the duration of each clock cycle. In contrast, when the configuration bit 106C is loaded so that the output of OR-gate 103C is selected then the pre-charge driver can exhibit a mode of behaviour which pre-charges the output node.

By loading appropriate configuration data to configuration bits 102C the multiplexer 101C can be configured to select one of a suitably delayed version of the clock signal and as a consequence, the output of the OR-gate 103C which has the non-delayed clock signal as its other input will provide a logical one at its output during an initial period of each clock cycle the initial period being equal to the delay time applied to the clock signal selected by the multiplexer 101C.

When the pre-charge driver is operational, the configuration bit 106C is set to select the first input of the multiplexer 104C and thus allows the output of the OR-gate 103C to propagate to the OR-gate 105C. Accordingly, in this example, the first input of the OR-gate 105C will be charged to and held at a logical zero for the selected 1, 2, 3 or 4 ns of each clock cycle and accordingly the output of the pre-charge driver will be at a logical high for the first 1 to 4 ns of a clock cycle. This pre-charge is the output node and holds it at the logical 1 for the first 1 to 4 ns of its clock cycle. After this period the output of the OR-gate 103C drops to logical zero and accordingly, the first input to the OR-gate 105C also drops to logical zero. The output node during this period becomes controlled directly by the signal provided at the input to the pre-charge driver.

Embodiment 4

Figure 11:
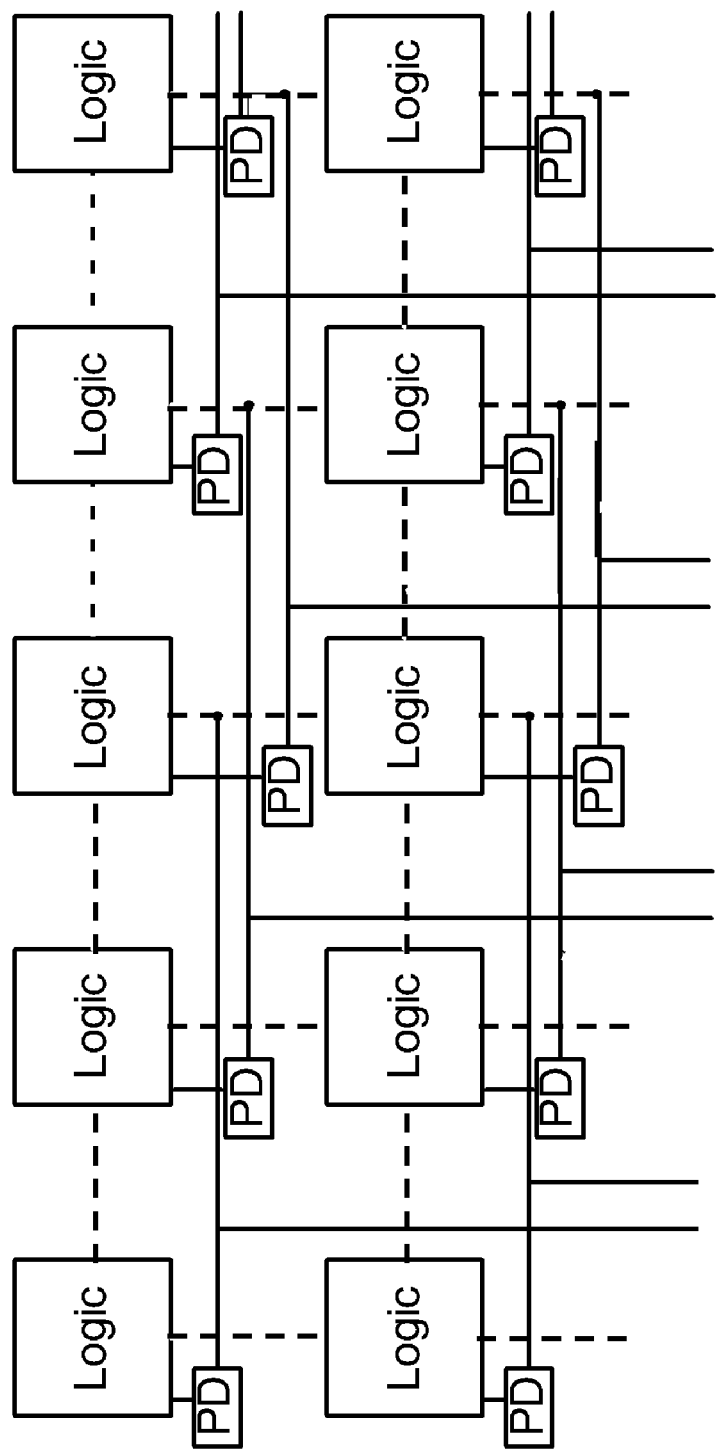
FIG. 11 shows an embodiment in which pre-charge driver circuits are used to connect logic units two or more logic blocks away from each other

FIG. 11 shows a further embodiment in which pre-charge driver circuits such as those shown in FIGS. 7A-10C are used to connect logic units which are two (or more) logic blocks away from each other, whereas short distance connectivity is handled by traditional buses (dashed line) without the use of a pre-charge driver. This allows the optimisation of the drivers to make sure that the signals propagating along the longer wires which are usually involved in critical paths are fast enough.

This embodiment has at least two advantages. Firstly, by not utilizing a pre-charge driver for every connection and only using them where necessary for longer connections the overall costs in terms of silicon area on the chip is constrained. Further, this arrangement actually maintains a speed for the short distance connections. This is because the OR-gate and the AND-gate on the output of the pre-charge driver circuit inherently adds a delay to the overall solution and its delay has to be recovered by the gains and speed provided by the behaviour of the circuit in routing the signals to a following stage.

Figure 12:
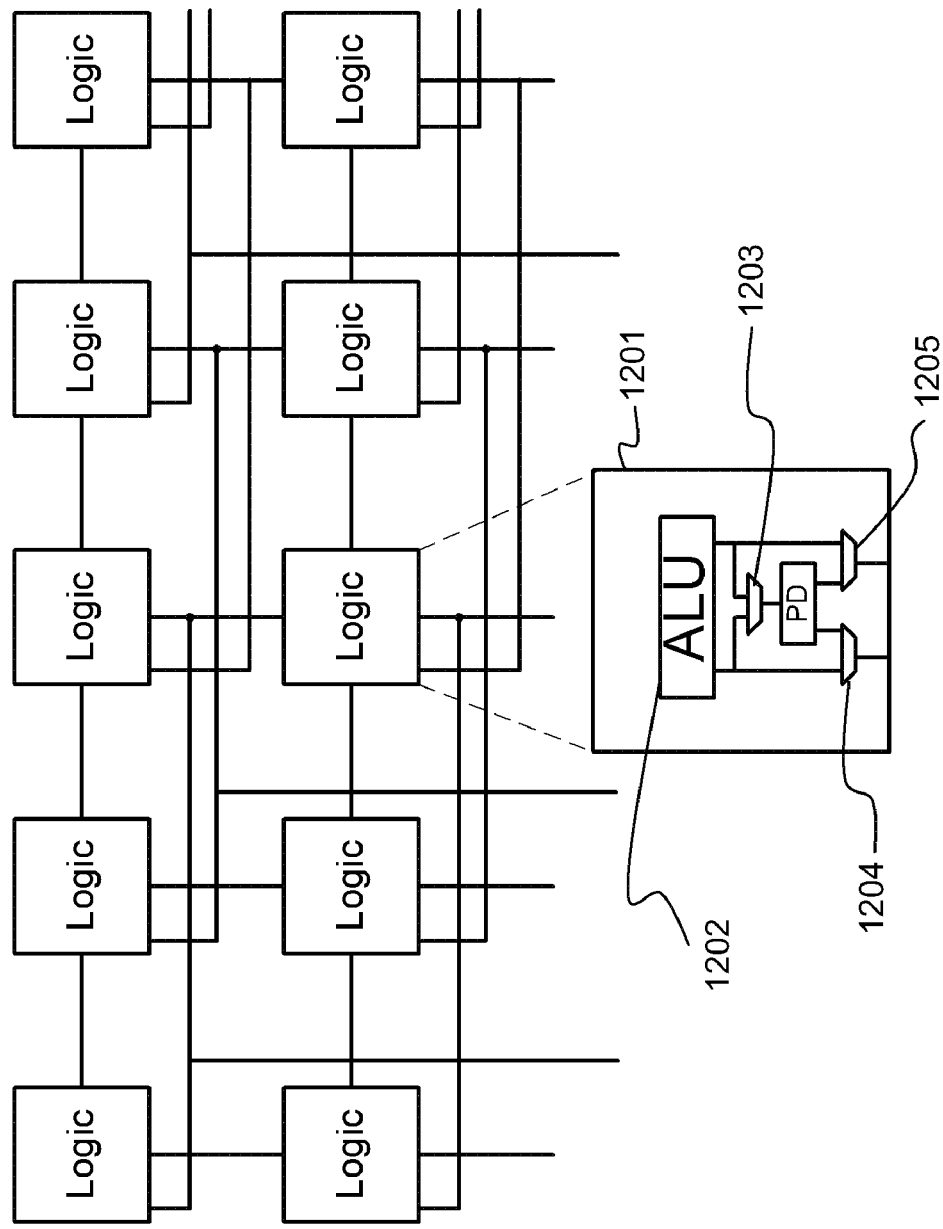
FIG. 12 shows a further possibility in which a pre-charge driver is provided as a shared resource for each tile in a programmable logic device.

FIG. 12 shows a further possibility in which a pre-charge driver is provided as a shared resource for each tile in a programmable logic device. Logic unit 1201 comprises an ALU 1202 having two outputs connected to a first multiplexer 1203 and further multiplexers 1204 and 1205 respectively. The pre-charge driver has two outputs connected as further inputs to their respective multiplexers 1204 and 1205. Accordingly, by appropriate configuration of the multiplexers it is possible to select whether an output is connected to conventional buses or through the pre-driver circuit. This provides additional flexibility with which to optimise the overall speed of the device. The disadvantage being that the additional multiplexers connected to the ALU contribute to the inherent delay in much the same way as the previous embodiment. However, in a large device these losses can be recovered by the gains made with delay over the longer connections in the routing network.

In a further embodiment the pre-charge driver circuits can be applied to input/output ports of a programmable logic device only in order to reduce delay on the inputs and outputs of an area of programmable logic.

In another alternative embodiment, pre-charge drivers would be applied only to complex functional units having a high delay (for instance, multipliers). In this way, the pre-charge driver behaviour can be utilized where it is most needed and excessive silicon area devoted to routing resources can be avoided.

INDUSTRIAL APPLICABILITY

This above embodiments and variations thereof can be used in several electronic devices like TVs, PCs, and so on.

The invention claimed is:

1. A programmable logic device including a logic block, a pre-charge driving device and a routing network, pre-charge driving device comprising:
    a first selecting device for selecting one of a plurality of delayed clock signals;
    a pre-charge drive signal generator outputting a pre-charge drive signal based upon the selected one of the plurality of delayed clock signals and a master clock signal;
    a second selecting device for selecting one of the pre-charge drive signal or a constant signal; and
    an output circuit for generating a pre-charge output signal to the routing network based upon an output signal of the second selecting device and a logic delay output signal received from the logic block,
    wherein the pre-charge drive signal generator is configured to generate the pre-charge drive signal for a time duration starting from the beginning of a clock cycle indicated by the master clock signal to a delay time corresponding to the selected one of the plurality of delayed clock signals.

2. The programmable logic device of claim 1, wherein the time duration is greater than or equal to a maximum time necessary for the logic delay to generate the logic delay output signal.

3. The programmable logic device of claim 1, wherein the pre-charge driver device is configured to generate the pre-charge drive signal during the time duration as a high signal, and a transition time duration for which the pre-charge output signal transitions from high to low is less than a transition duration for which the pre-charge output signal transitions from low to high.

4. The programmable logic device of claim 1, wherein the pre-charge driver device is configured to generate the pre-charge drive signal during the time duration as a low signal, and a transition time duration for which the pre-charge output signal transitions from low to high is less than a transition duration for which the pre-charge output signal transitions from high to low.

5. A programmable logic device comprising a plurality of logic blocks and a plurality of routing networks, wherein
    one of the plurality of routing networks which receives an output signal of one of the plurality of logic blocks and a master clock signal comprises a pre-charge driver which includes
    a delayed clock signal generator which generates a delayed clock signal which delays predetermined time than a master clock signal,
    a pre-charge drive signal generator which receives the output signal of the delayed clock signal generator and the master clock signal and output a pre-charge drive signal,
    an enable circuit which receives an output signal of the pre-charge drive signal generator and output one of a constant signal or the pre-charge drive signal, and
    an output circuit which receives an output signal of the enable circuit and the output signal of one of the plurality of logic blocks and output one of the input signal.

* * * * *